(12) United States Patent
Park et al.

(10) Patent No.: US 11,238,765 B2
(45) Date of Patent: Feb. 1, 2022

(54) DISPLAY DEVICE

(71) Applicant: Samsung Display Co., Ltd., Yongin-Si (KR)

(72) Inventors: Youngok Park, Hwaseong-si (KR); Uikang Kim, Seoul (KR); Junggeun Lee, Yongin-si (KR)

(73) Assignee: Samsung Display Co., Ltd.

( * ) Notice: Subject to any disclaimer, the term of this patent is extended or adjusted under 35 U.S.C. 154(b) by 0 days.

(21) Appl. No.: 17/203,506

(22) Filed: Mar. 16, 2021

(65) Prior Publication Data
US 2021/0287587 A1 Sep. 16, 2021

(30) Foreign Application Priority Data

Mar. 16, 2020 (KR) .................. 10-2020-0031869
Mar. 4, 2021 (KR) .................. 10-2021-0029102

(51) Int. Cl.
G09G 3/00 (2006.01)
G09G 3/20 (2006.01)
(Continued)

(52) U.S. Cl.
CPC ........... G09G 3/006 (2013.01); G09G 3/2003 (2013.01); G02F 1/1309 (2013.01);
(Continued)

(58) Field of Classification Search
CPC .. G09G 3/006; G09G 3/2003; G09G 2330/10; G09G 2330/04; G09G 2330/12;
(Continued)

(56) References Cited

U.S. PATENT DOCUMENTS 5,946,177 A  8/1999  Miller et al.
5,973,658 A * 10/1999 Kim .................. G02F 1/136204
                                                              345/92

(Continued)

FOREIGN PATENT DOCUMENTS

JP       2019-050323 A    3/2019
KR       10-1041265 B1    6/2011
KR    10-2018-0005825 A   1/2018

OTHER PUBLICATIONS

Jian Chen, Fariborz Assaderaghi, Ping-Keung Ko, Chenming Hu, "The Enhancement of Gate-Induced-Drain-Leakage (GIDL) Current in Short-Channel SOI MOSFET and its Application in Measuring Lateral Bipolar Current Gain β", IEEE Electron Device Letters, vol. 13, No. 11, Nov. 1992, pp. 572-574.

Primary Examiner — Michael J Jansen, II
(74) Attorney, Agent, or Firm — Innovation Counsel LLP

(57) ABSTRACT

A display device includes a substrate, a plurality of pixel columns, and a lighting test circuit unit. The lighting test circuit unit is disposed in a non-display area on the substrate, includes a plurality of lighting test transistors, and provides a lighting test voltage to the pixel columns. Each of the lighting test transistors includes an active pattern including a source area, a drain area, and a channel area, a gate electrode disposed in the channel area, an interlayer insulating layer including a first contact hole spaced apart from a first side of the gate electrode by about 7 um or more, and a source electrode contacting the source area of the active pattern through the first contact hole.

16 Claims, 5 Drawing Sheets

(51) Int. Cl.
   *G02F 1/1362* (2006.01)
   *G02F 1/13* (2006.01)
(52) U.S. Cl.
   CPC .. *G02F 1/136204* (2013.01); *G02F 1/136254* (2021.01); *G02F 2203/69* (2013.01); *G09G 2300/0452* (2013.01); *G09G 2310/0275* (2013.01); *G09G 2310/0297* (2013.01); *G09G 2310/08* (2013.01); *G09G 2330/04* (2013.01); *G09G 2330/06* (2013.01); *G09G 2330/08* (2013.01); *G09G 2330/10* (2013.01); *G09G 2330/12* (2013.01)
(58) Field of Classification Search
   CPC ........... G09G 2330/08; G09G 2330/06; G09G 2310/08; G09G 2310/0297; G09G 2300/0452; G09G 2310/0275; G02F 2203/69; G02F 1/136204; G02F 1/136254; G02F 1/1309
   See application file for complete search history.

(56) References Cited

U.S. PATENT DOCUMENTS

| | | | | |
|---|---|---|---|---|
| 6,337,722 B1 * | 1/2002 | Ha | ................... | G02F 1/136204 257/360 |
| 6,841,434 B2 * | 1/2005 | Miyairi | ............ | H01L 29/66757 438/166 |
| 7,342,579 B2 * | 3/2008 | Chou | ................ | G02F 1/136204 345/214 |
| 7,755,709 B2 * | 7/2010 | Lee | ....................... | G09G 3/3648 349/42 |
| 8,138,781 B2 * | 3/2012 | Wang | ................... | G09G 3/006 324/760.02 |
| 9,147,619 B2 * | 9/2015 | Lee | ........................ | G09G 3/006 |
| 9,191,663 B2 * | 11/2015 | Kwak | .................... | G09G 3/006 |
| 9,245,468 B2 * | 1/2016 | Lee | ........................ | G09G 3/006 |
| 9,251,758 B2 * | 2/2016 | Teranishi | ............. | G06F 3/0412 |
| 9,262,952 B2 * | 2/2016 | Kim | ...................... | G09G 3/006 |
| 9,595,213 B2 * | 3/2017 | Kim | ...................... | G09G 3/006 |
| 9,728,532 B2 | 8/2017 | Muthukrishnan et al. | | |
| 10,403,704 B2 * | 9/2019 | Chae | ..................... | H01L 27/3262 |
| 10,741,111 B2 * | 8/2020 | Hong | ...................... | G09G 3/006 |
| 10,847,432 B2 * | 11/2020 | Ka | ......................... | H01L 27/1251 |
| 10,854,166 B2 * | 12/2020 | Xi | ........................... | H03K 17/693 |
| 10,930,790 B2 * | 2/2021 | Kim | ...................... | H01L 29/7869 |
| 11,017,699 B2 * | 5/2021 | Kim | ...................... | G09G 3/006 |
| 11,081,063 B2 * | 8/2021 | Cho | ....................... | G09G 3/3233 |
| 2003/0219935 A1 * | 11/2003 | Miyairi | ................... | C30B 29/06 438/166 |
| 2006/0077162 A1 * | 4/2006 | Chou | ................ | G02F 1/136204 345/92 |
| 2009/0233392 A1 * | 9/2009 | Lee | ....................... | G09G 3/3648 438/30 |
| 2010/0073009 A1 * | 3/2010 | Wang | ...................... | G09G 3/006 324/537 |
| 2011/0310516 A1 | 12/2011 | Christensen | | |
| 2013/0092937 A1 * | 4/2013 | Lee | ......................... | G09G 3/006 257/48 |
| 2014/0240521 A1 * | 8/2014 | Kwak | ................... | H04N 17/004 348/189 |
| 2014/0292711 A1 * | 10/2014 | Teranishi | ............. | G09G 3/3696 345/174 |
| 2014/0354285 A1 * | 12/2014 | Kim | ...................... | G09G 3/3233 324/414 |
| 2014/0354286 A1 * | 12/2014 | Kim | ...................... | G09G 3/3225 324/414 |
| 2015/0090961 A1 * | 4/2015 | Lee | ......................... | G09G 3/006 257/40 |
| 2017/0221979 A1 * | 8/2017 | Chae | .................... | H01L 27/3279 |
| 2018/0053473 A1 * | 2/2018 | Wang | ..................... | G09G 3/006 |
| 2018/0076102 A1 * | 3/2018 | Ka | ....................... | H01L 27/3262 |
| 2018/0350995 A1 * | 12/2018 | Kim | ..................... | H01L 29/24 |
| 2019/0304378 A1 * | 10/2019 | Cho | ...................... | G09G 3/3291 |
| 2019/0311662 A1 * | 10/2019 | Kim | ...................... | G09G 3/2003 |
| 2020/0126506 A1 * | 4/2020 | Xi | ............................. | G09G 3/20 |
| 2020/0135070 A1 * | 4/2020 | Hong | ...................... | G09G 3/006 |
| 2020/0327834 A1 * | 10/2020 | Kim | ...................... | G09G 3/2074 |
| 2021/0142702 A1 * | 5/2021 | Lee | ......................... | G09G 3/006 |
| 2021/0143279 A1 * | 5/2021 | Kim | ....................... | H01L 29/24 |
| 2021/0256921 A1 * | 8/2021 | Yu | ........................ | G09G 3/3607 |
| 2021/0287587 A1 * | 9/2021 | Park | ...................... | G09G 3/006 |

* cited by examiner

DISPLAY DEVICE

CROSS-REFERENCE TO RELATED APPLICATION(S)

This application claims priority from and the benefit of Korean Patent Application No. 10-2020-0031869, filed on Mar. 16, 2020 and Korean Patent Application No. 10-2021-0029102, filed on Mar. 4, 2021 which are hereby incorporated by reference for all purposes as if fully set forth herein.

BACKGROUND

1. Field

Example embodiments of the present disclosure relate generally to a display device. More particularly, example embodiments of the present disclosure relate to the display device with improved display quality.

2. Description of the Related Art

A display device includes pixels and may display an image based on signals and voltages provided to the pixels.

Meanwhile, whether the display device is damaged (e.g., whether a wiring, a pixel, etc. is damaged) may be detected through a lighting test. In this case, a lighting test transistor for the lighting test may be formed in the display device, and an insulation breakdown phenomenon may occur in the lighting test transistor by a static electricity generated in a manufacturing process of the display device. When the insulation breakdown phenomenon occurs, an insulating layer loses insulating nature and becomes conductive, and a short may occur in the lighting test transistor. When the display device is driven, since a data voltage is provided to the pixel through the lighting test transistor, a display quality of the display device may be deteriorated due to the short.

The above information disclosed in this Background section is only for understanding of the background of the inventive concepts, and, therefore, it may contain information that does not constitute prior art.

SUMMARY

Display devices constructed according to the principles and example implementations of the present disclosure may provide a display device with improved display quality.

Additional features of the present disclosure will be set forth in the description which follows, and in part will be apparent from the description, or may be learned by practice of the inventive concepts.

A display device according to an example embodiment may include a substrate, a plurality of pixel columns, and a lighting test circuit unit. The substrate may include a display area and a non-display area adjacent to the display area. The plurality of pixel columns may be disposed in the display area on the substrate. The lighting test circuit unit may be disposed in the non-display area on the substrate, may include a plurality of lighting test transistors, and may provide a lighting test voltage to the pixel columns. Each of the lighting test transistors may include an active pattern disposed in the non-display area on the substrate and including a source area, a drain area, and a channel area, a gate electrode disposed in the channel area on the active pattern, an interlayer insulating layer covering the gate electrode, and including a first contact hole exposing a part of the source area of the active pattern and being spaced apart from a first side of the gate electrode by about 7 um or more, and a source electrode contacting the source area of the active pattern through the first contact hole.

According to an example embodiment, the interlayer insulating layer may further include a second contact hole exposing a part of the drain area of the active pattern and being spaced apart by about 7 um or more from a second side of the gate electrode and each of the lighting test transistors may further include a drain electrode contacting the drain area of the active pattern through the second contact hole.

According to an example embodiment, a distance from a center of the first contact hole to the first side of the gate electrode may be equal to a distance from a center of the second contact hole to the second side of the gate electrode.

According to an example embodiment, a length from the first side of the gate electrode to the second side of the gate electrode may be about 3 um to about 4 um.

According to an example embodiment, a distance between a center of the first contact hole and a center of the second contact hole may be about 17 um or more.

According to an example embodiment, each of the lighting test transistors may further include a gate insulating layer being interposed between the substrate and the interlayer insulating layer and covering the active pattern, and each of the first and second contact holes may penetrate the gate insulating layer to expose the source and the drain areas, respectively.

According to an example embodiment, the display device may further include a data driver disposed in the non-display area on the substrate and generating a data voltage, and the lighting test circuit unit may be disposed between the pixel columns and the data driver.

According to an example embodiment, the display device may further include a demultiplexer disposed between the lighting test circuit unit and the pixel columns in the non-display area on the substrate, and the demultiplexer may receive the data voltage from the data driver and may provide the data voltage to the pixel columns.

According to an example embodiment, the source electrode may be adjacent to the data driver, and the drain electrode may be adjacent to the demultiplexer.

According to an example embodiment, the display device may further include an antistatic circuit unit disposed in the non-display area on the substrate, electrically connected to the lighting test circuit unit, and measuring a voltage level of the lighting test voltage, and when the antistatic circuit unit measures the voltage level of the lighting test voltage to be higher than a preset voltage level, the lighting test voltage may not be provided to the lighting test transistors.

According to an example embodiment, a maximum distance between the first side of the gate electrode and the first contact hole may be determined by the preset voltage level.

According to an example embodiment, the pixel columns may include a first pixel column in which a first pixel displaying a first color and a second pixel displaying a second color are repeatedly arranged, a second pixel column in which a third pixel displaying a third color is arranged, and a third pixel column in which the second pixel and the first pixel are repeatedly arranged.

According to an example embodiment, the lighting test circuit unit may alternately provide the lighting test voltage to the first pixel included in the first pixel column and the third pixel column, and the second pixel included in the first pixel column and the third pixel column.

According to an example embodiment, the lighting test transistors may include a first lighting test transistor, a second lighting test transistor, and a third lighting test transistor, the first and second lighting test transistors may be electrically connected to the first pixel column and the third pixel column, and the third lighting test transistor may be electrically connected to the second pixel column.

According to an example embodiment, the lighting test voltage may include a first lighting test voltage, a second lighting test voltage, and a third lighting test voltage, the first lighting test transistor may provide a first lighting test voltage to the first pixel in response to a first test control signal, the second lighting test transistor may provide a second lighting test voltage to the second pixel in response to a second test control signal, and the third lighting test transistor may provide a third lighting test voltage to the third pixel in response to a third test control signal.

According to an example embodiment, the display device may further include a data driver generating a data voltage which is provided to the pixel columns, a gate driver generating a scan signal which is provided to the pixel columns, and a timing controller generating a control signal which controls the data driver and the gate driver.

Therefore, the display device according to example embodiments may include lighting test transistor having a first distance of about 7 um or more. Accordingly, a charge mobility of the lighting test transistor may be lowered, and an insulation breakdown phenomenon due to a static electricity generated in a manufacturing process of the display device may not occur. Accordingly, the display device may perform a lighting test, and whether the display device is damaged may be detected through the lighting test. In addition, the lighting test transistor may not be short. Therefore, when the display device is driven, a display quality may be improved.

It is to be understood that both the foregoing general description and the following detailed description are example and explanatory and are intended to provide further explanation of the present disclosure as claimed.

BRIEF DESCRIPTION OF THE DRAWINGS

The accompanying drawings, which are included to provide a further understanding of the present disclosure and are incorporated in and constitute a part of this specification, illustrate example embodiments of the present disclosure, and together with the description serve to explain the inventive concepts.

DETAILED DESCRIPTION

Illustrative, non-limiting example embodiments will be more clearly understood from the following detailed description in conjunction with the accompanying drawings.

Figure 1:
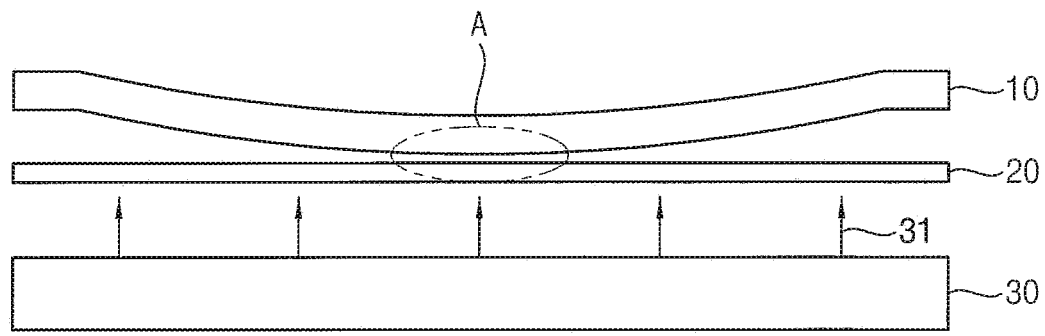
FIGS. 1 and 2 are diagrams illustrating a manufacturing process of a display device according to example embodiments.
Figure 2:
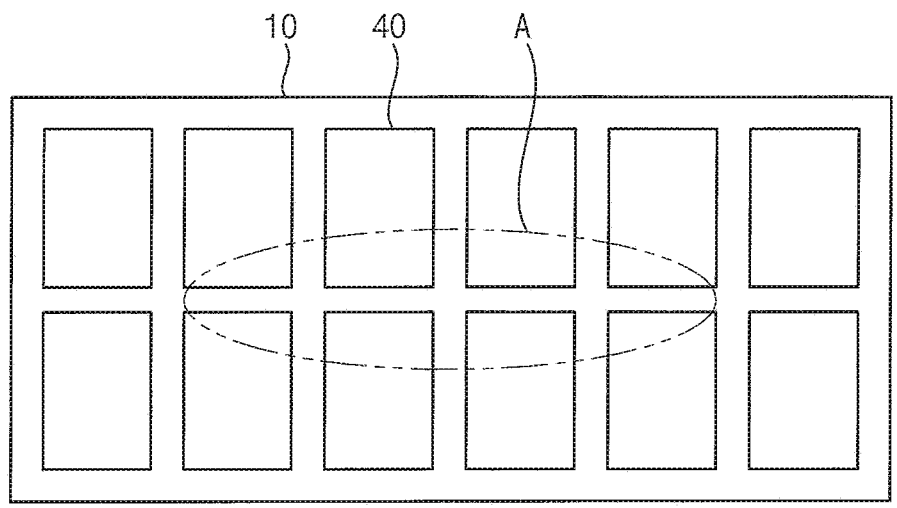

FIGS. 1 and 2 are diagrams illustrating a manufacturing process of a display device according to example embodiments.

Referring to FIGS. 1 and 2, on a mother substrate 10, a plurality of cell areas 40 may be arranged in a grid shape. A display device 1000 of FIG. 3 may be formed in the cell areas 40, respectively. After the mother substrate 10 is aligned with a mask 20 in which a plurality of openings are formed, a depositing material 31 may be deposited on the cell areas 40 of the mother substrate 10 by passing through the openings from the evaporation source 30. Here, the cell area 40 may include a display area DA of FIG. 3 and a non-display area NDA of FIG. 3. For example, the depositing material 31 may be an organic material included in a pixel (e.g., a pixel PX of FIG. 3) disposed in the display area DA.

Figure 4:
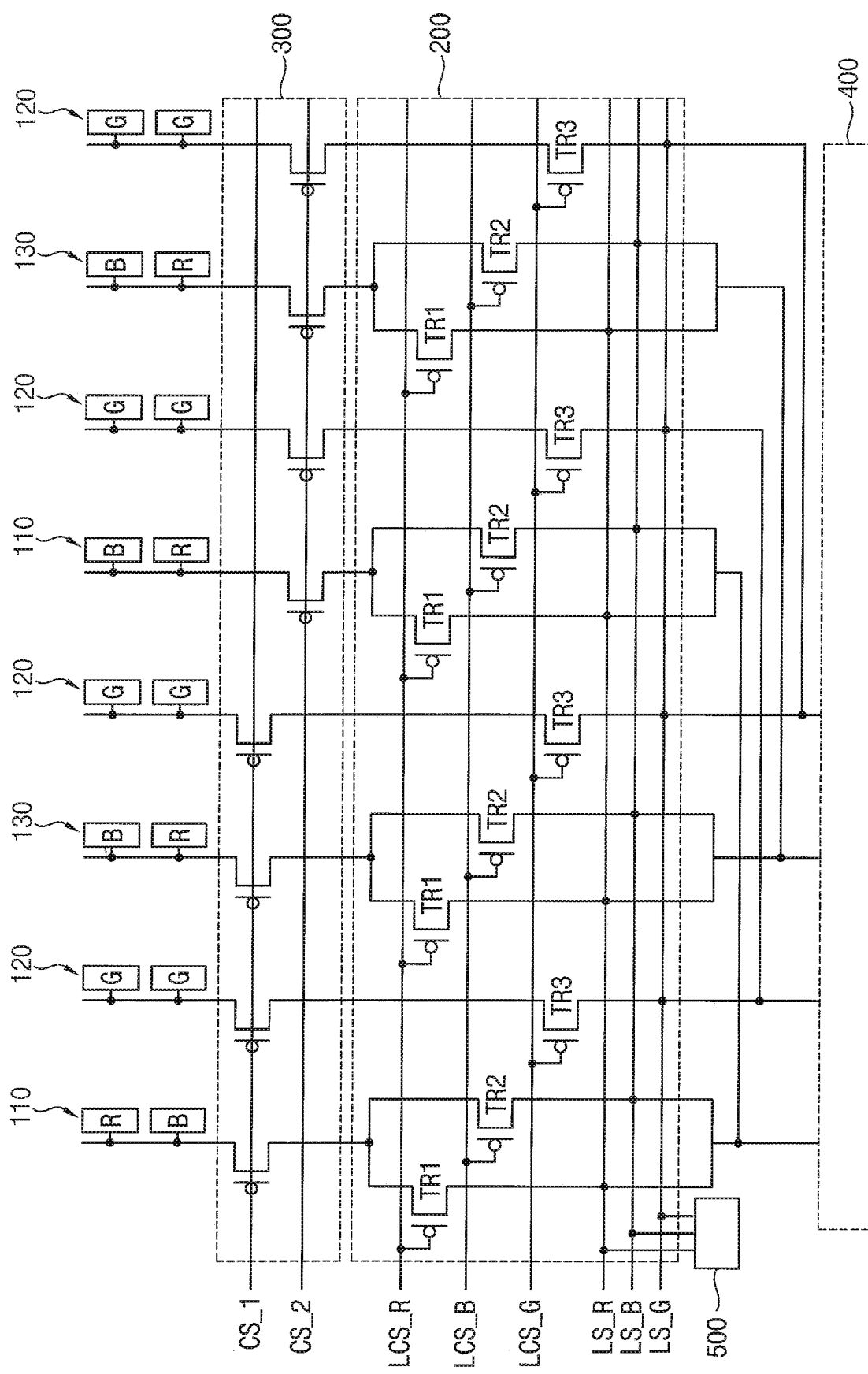
FIG. 4 is a circuit diagram illustrating the display device of FIG. 3.

In an example embodiment, pixel transistors may be disposed under the organic material in the display area DA, and the lighting test transistors (e.g., first to third lighting test transistors TR1, TR2, and TR3 of FIG. 4) for a lighting test of the pixel may be disposed in the non-display area NDA. In a process of aligning the mother substrate 10 and the mask 20 in a line, a central portion A of the mother substrate 10 may sag as shown in FIG. 1. As the central portion A of the mother substrate 10 sags, the central portion A of the mother substrate 10 may be close to the mask 20 or may directly contact the mask 20. In this case, a static electricity may be generated in the central portion A of the mother substrate 10, and thus, the lighting test transistors disposed in the central portion A may be damaged due to the static electricity.

For example, in order to align the mother substrate 10 with the mask 20 in a line, an alignment speed of the mother substrate 10 may be set to about 300 mm/s, and a distance between the mother substrate 10 and the mask 20 may be set to about 5 mm. In this case, the static electricity having a voltage level of about 500V may be generated in the central portion A of the mother substrate 10. As a result, an insulation breakdown phenomenon may occur in the lighting test transistors of the display device 1000 which is manufactured in the cell area 40 located in the central portion A of the mother substrate 10. When an insulation breakdown phenomenon occurs, an insulating layer (e.g. a gate insulating layer 250 of FIG. 6 or a interlayer insulating layer 270 of FIG. 6) included in the lighting test transistor may lose insulating effect and may become conductive, and a short may occur in the lighting test transistor. When the display device 1000 is driven, since a data voltage is provided to the pixel through the lighting test transistor, a display quality of the display device 1000 may be deteriorated due to the short.

Figure 3:
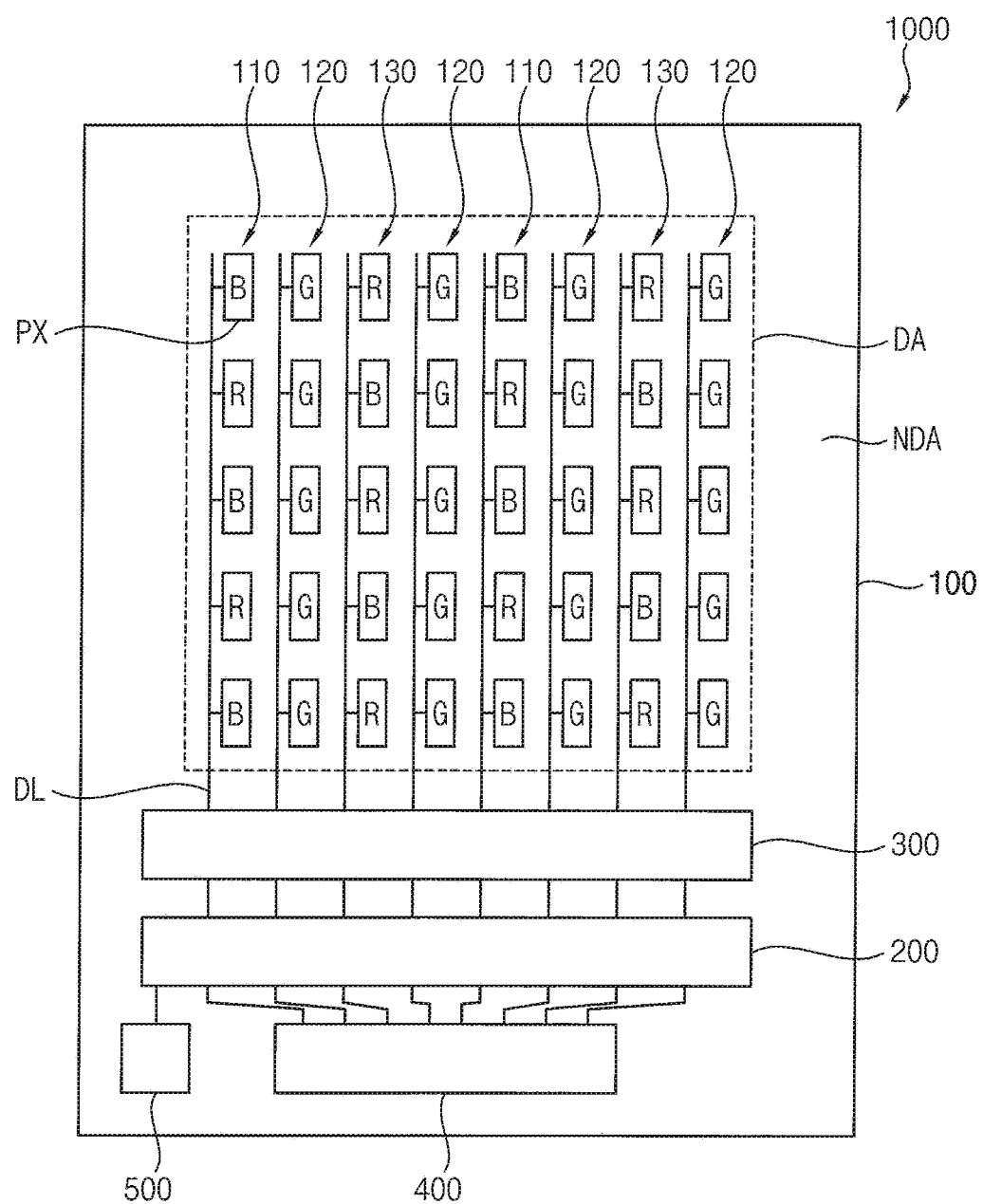
FIG. 3 is a diagram illustrating a display device according to example embodiments.

FIG. 3 is a diagram illustrating a display device according to example embodiments.

Referring to FIG. 3, for example, the display device 1000 may be formed in each of cell areas 40 and may be separated from the mother substrate 10 by performing cell cutting. The display device 1000 may include a substrate 100, data lines DL, a plurality of pixel columns 110, 120, and 130, a lighting test circuit unit 200, a demultiplexer 300, a data driver 400, and an antistatic circuit unit 500.

The substrate 100 may include a display area DA and a non-display area NDA adjacent to the display area DA.

The data lines DL may be disposed in the display area DA on the substrate 100. For example, the data lines DL may extend in a column direction and may be arranged side by side in a row direction perpendicular to the column direction. The data lines DL may be electrically connected to the pixel columns 110, 120, and 130, respectively.

The pixel columns 110, 120, and 130 may be disposed parallel to the data lines DL. Each of the pixel columns 110, 120, and 130 may include pixels PX. During the lighting test of the display device 1000, the pixels PX may emit lights in response to a lighting test voltage provided through the data lines DL.

In an example embodiment, the pixel columns 110, 120, and 130 may include a first pixel column 110, a second pixel column 120, and a third pixel column 130. The first pixel column 110 may include a first pixel R displaying a first color and a second pixel B displaying a second color, and the first pixel R and the second pixel B may be repeatedly arranged in the first pixel column 110. The second pixel column 120 may include a third pixel G displaying a third color, and the third pixel G may be repeatedly arranged in the second pixel column 120. The third pixel column 130 may include a first pixel R and a second pixel B, and the first pixel R and the second pixel B may be repeatedly arranged in the third pixel column 130. In this case, the first pixel R and the second pixel B included in the third pixel column 130 may be arranged in a reverse order with the first pixel R and the second pixel B included in the first pixel column 110. For example, the first color may be red, the second color may be blue, and the third color may be green.

In an example embodiment, as shown in FIG. 3, a first pixel column 110, a second pixel column 120, a third pixel column 130, and a second pixel column 120 may be repeatedly arranged in the display area DA on the substrate 100. Meanwhile, the order in which the pixel columns 110, 120, and 130 are arranged is not limited thereto. Also, although the eight pixel columns 110, 120 and 130 are illustrated in FIG. 3, the number of pixel columns 110, 120, and 130 is not limited thereto.

The lighting test circuit unit 200 may be disposed in the non-display area NDA on the substrate 100. The lighting test circuit unit 200 may provide the lighting test voltage to the pixel columns 110, 120, and 130 through the data lines DL during the lighting test of the display device 1000.

In an example embodiment, the lighting test circuit unit 200 may alternately provide the lighting test voltage to the first pixel R and the second pixel B included in the first pixel column 110 and the third pixel column 130. For example, the lighting test circuit unit 200 may detect a lighting failure of the first pixel R by providing a first lighting test voltage to emit the first pixel R. Thereafter, the lighting test circuit unit 200 may detect the lighting failure of the second pixel B by providing a second lighting test voltage to emit the second pixel B.

In an example embodiment, the lighting test circuit unit 200 may provide the lighting test voltage to the third pixel G included in the second pixel column 120. For example, the lighting test circuit unit 200 may detect the lighting failure of the third pixel G by providing a third lighting test voltage to emit the third pixel G.

In addition, the lighting test circuit unit 200 may not operate when the display device 1000 is driven. For example, when the display device 1000 is driven, the lighting test transistor included in the lighting test circuit unit 200 may be turned off.

The demultiplexer 300 may be disposed between the lighting test circuit unit 200 and the pixel columns 110, 120, and 130 in the non-display area NDA on the substrate 100. When the display device 1000 is driven, the demultiplexer 300 may receive a data voltage from the data driver 400 and may provide the data voltage to the pixel columns 110, 120, and 130 through the data lines DL.

The data driver 400 may generate the data voltage, and when the display device 1000 is driven, the data voltage may be provided to the pixel columns 110, 120, and 130 through the demultiplexer 300 and the data lines DL. In an example embodiment, the data driver 400 may be disposed in the non-display area NDA on the substrate 100. In another example embodiment, the data driver 400 may be disposed on a flexible printed circuit board ("FPCB") in a chip-on-film ("COF") form.

The antistatic circuit unit 500 may be disposed in the non-display area NDA on the substrate 100. The antistatic circuit unit 500 will be described in detail with reference to FIG. 4.

FIG. 4 is a circuit diagram illustrating the display device of FIG. 3.

Referring to FIGS. 3 and 4, the lighting test circuit unit 200 may include first to third lighting test transistors TR1, TR2, and TR3. During the lighting test of the display device 1000, the first to third lighting test transistors TR1, TR2, and TR3 may provide the lighting test voltage to the first to third pixels R, G, and B. For example, the first and second lighting test transistors TR1 and TR2 may be electrically connected to the first pixel column 110 and the third pixel column 130, and the third lighting test transistor TR3 may be electrically connected to the pixel column 120.

The first lighting test transistor TR1 may provide a first lighting test voltage LS_R to the first pixel R in response to a first test control signal LCS_R. The first test control signal LCS_R may have voltage levels for turning on or off the first lighting test transistor TR1, and the first lighting test voltage LS_R may have a voltage level for emitting the first pixel R. For example, a gate terminal of the first lighting test transistor TR1 may be provided with the first test control signal LCS_R, a source terminal may be provided with the first lighting test voltage LS_R, and a drain terminal may provide the first lighting test voltage LS_R to the first pixel column 110 or the third pixel column 130.

The second lighting test transistor TR2 may provide a second lighting test voltage LS_R to the second pixel B in response to a second test control signal LCS_B. The second test control signal LCS_B may have voltage levels for turning on or off the second lighting test transistor TR2, and the second lighting test voltage LS_B may have a voltage level for emitting the second pixel B. For example, a gate terminal of the second lighting test transistor TR2 may be provided with the second test control signal LCS_B, a source terminal may be provided with the second lighting test voltage LS_B, and a drain terminal may provide the second lighting test voltage LS_B to the first pixel column 110 or the third pixel column 130.

The first pixel R may emit a light by receiving the first lighting test voltage LS_R, and the second pixel B may emit a light by receiving the second lighting test voltage LS_B. For example, the voltage level of the first lighting test voltage LS_R may be higher than the voltage level of the second lighting test voltage LS_B. In addition, as described above, the lighting test circuit unit 200 may alternately provide the lighting test voltages LS_R and LS_B to the first pixel R and the second pixel B. For example, the first and second test control signals LCS_R and LCS_B may be alternately provided to the first and second lighting test transistors TR1 and TR2, respectively.

The third lighting test transistor TR3 may provide a third lighting test voltage LS_G to the third pixel G in response to a third test control signal LCS_G. The third test control signal LCS_G may have voltage levels for turning on or off the third lighting test transistor TR3, and the third lighting test voltage LS_G may have a voltage level for emitting the third pixel G. For example, a gate terminal of the third lighting test transistor TR3 may be provided with the third test control signal LCS_G, a source terminal may be provided with the third lighting test voltage LS_G, and a drain terminal may provide the third lighting test voltage LS_G to the second pixel column 120.

The demultiplexer 300 may include a plurality of control transistors. When the display device 1000 is driven, the control transistors may provide the data voltage to the first to third pixels R, G, and B in response to the control signals CS_1 and CS_2.

As described above, when the display device 1000 is driven, the data driver 400 may generate the data voltage, and may provide the data voltage to the first to third pixels R, G, and B through the demultiplexer 300 and the data lines DL.

The antistatic circuit unit 500 may be electrically connected to the lighting test circuit unit 200 and may measure voltage levels of the first to third lighting test voltages LS_R, LS_G, and LS_B provided to the lighting test circuit unit 200. When the antistatic circuit unit 500 measures the voltage level of at least one of the first to third lighting test voltages LS_R, LS_G, and LS_B to be higher than a preset voltage level, a voltage having the voltage level may not be provided to the first to third lighting test transistors TR1, TR2, and TR3. In other words, the static electricity may be generated in at least one of the lines that transmit the first to third lighting test voltages LS_R, LS_B, and LS_G, and the antistatic circuit unit 500 may prevent the static electricity generated in the line from being provided to the first to third lighting test transistors TR1, TR2, and TR3. For example, when the preset voltage level set in the antistatic circuit unit 500 is about 6.5V and the voltage level of the voltage transmitted through the line is about 7V, the antistatic circuit unit 500 may prevent the voltage of about 7V from being provided to the first to third lighting test transistors TR1, TR2, and TR3.

Figure 5:
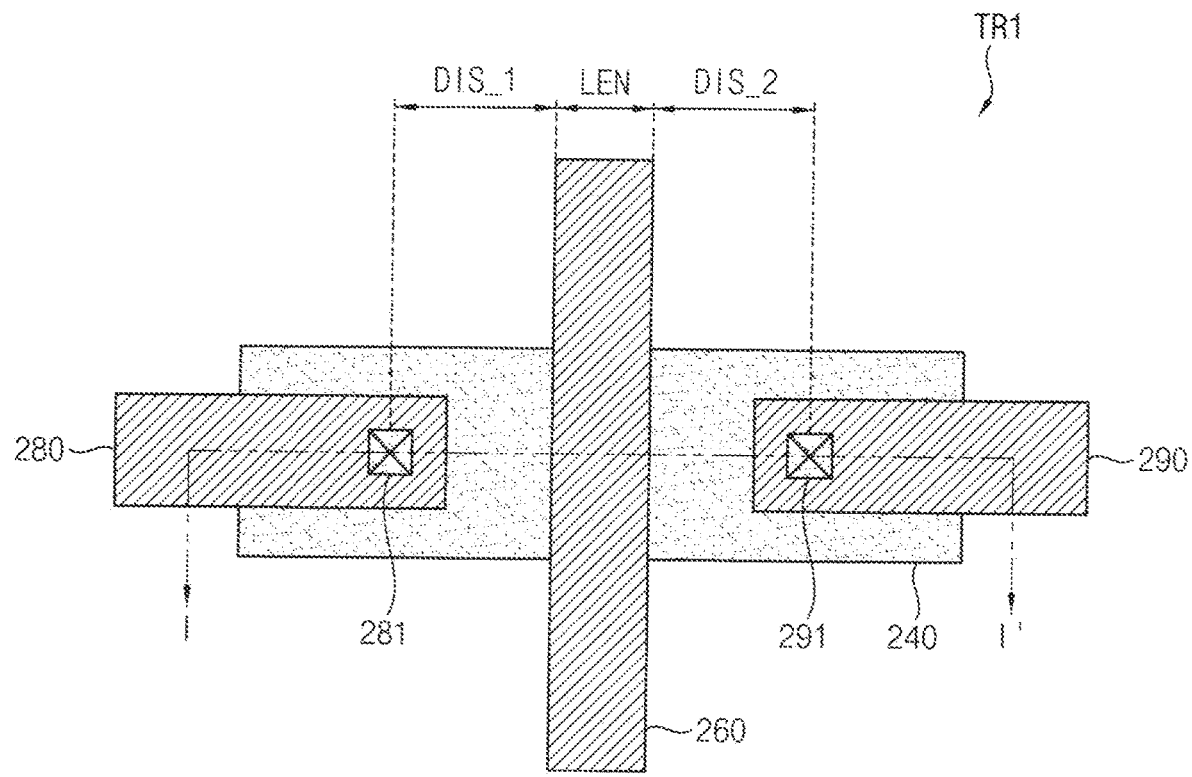
FIG. 5 is a plan view illustrating a lighting test transistor included in the display device of FIG. 3.
Figure 6:
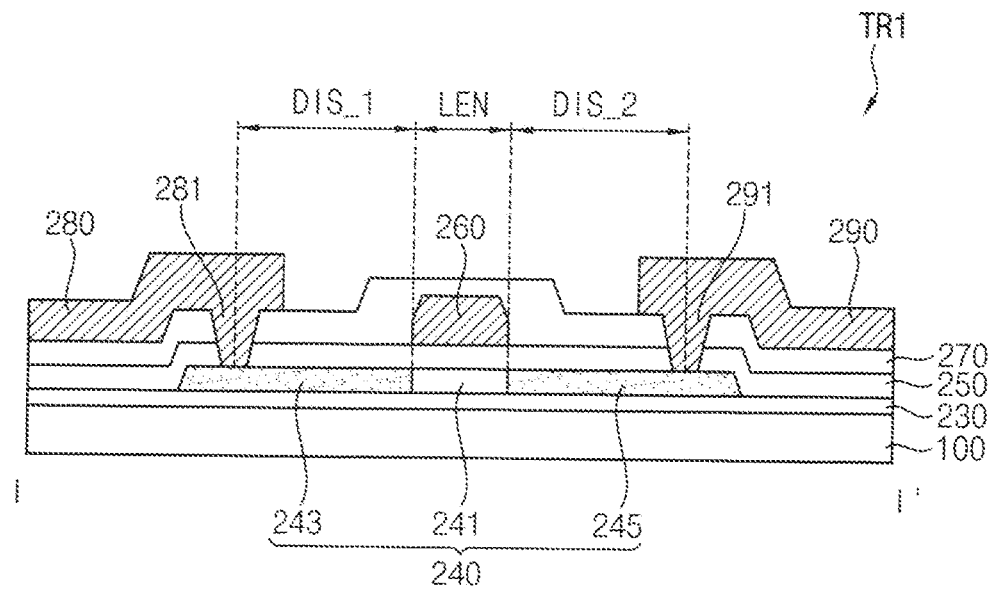
FIG. 6 is a cross-sectional view taken along line I-I' of FIG. 5.

FIG. 5 is a plan view illustrating a lighting test transistor included in the display device of FIG. 3. FIG. 6 is a cross-sectional view taken along line I-I' of FIG. 5.

Referring to FIGS. 3, 4, 5, and 6, each of the first to third lighting test transistors TR1, TR2, and TR3 may include an active pattern 240, a gate insulating layer 250, a gate electrode 260, an interlayer insulating layer 270, a source electrode 280, and a drain electrode 290.

In an example embodiment, a buffer layer 230, the active pattern 240, the gate insulating layer 250, the gate electrode 260, the interlayer insulating layer 270, the source electrode 280, and the drain electrode 290 may be sequentially formed on the substrate 100.

The buffer layer 230 may be disposed on the substrate 100. The buffer layer 230 may prevent diffusion of metal atoms or impurities from the substrate 100 to the active pattern 240. In addition, the buffer layer 230 may control a heat transfer rate during a crystallization process for forming the active pattern 240. Meanwhile, the display device 1000 may not include the buffer layer 230.

The active pattern 240 may be disposed on the buffer layer 230. In an example embodiment, the active pattern 240 may include a silicon semiconductor (e.g., amorphous silicon or polycrystalline silicon) or a metal oxide semiconductor.

The active pattern 240 may include a source area 243, a drain area 245, and a channel area 241 between the source area 243 and the drain area 245. Impurities may be doped in the source and drain areas 243 and 245 of the active pattern 240. Accordingly, the channel area 241 of the active pattern 240 may have lower conductivity and higher resistance than the source and drain areas 243 and 245.

The gate insulating layer 250 may be interposed between the substrate 100 and the interlayer insulating layer 270 and may cover the active pattern 240. A first contact hole 281 and a second contact hole 291 may penetrate the gate insulating layer 250 and may expose parts of each of the source and drain areas 243 and 245 of the active pattern 240. The gate insulating layer 250 may include an insulating material. For example, the gate insulating layer 250 may include silicon oxide, silicon nitride, titanium oxide, tantalum oxide, or the like.

The gate electrode 260 may be disposed in the channel area 241 on the gate insulating layer 250. The gate electrode 260 may include a metal, an alloy, or a conductive metal oxide. For example, the gate electrode 260 is gold ("Au"), silver ("Ag"), copper ("Cu"), nickel ("Ni"), chromium ("Cr"), aluminum ("Al"), tungsten ("W"), molybdenum ("Mo"), titanium ("Ti"), tantalum ("Ta"), or an alloy thereof, and may have a single layer or a multilayer structure including different metal layers. Meanwhile, the gate electrode 260 may correspond to the gate terminal described with reference to FIG. 4.

Meanwhile, the gate electrode 260 may include a first side and a second side opposite to the first side. For example, as shown in FIG. 5, the gate electrode 260 may include the first side facing the source electrode 280 and the second side facing the drain electrode 290. In other words, a distance from the first side to the second side of the gate electrode 260 shown in FIG. 5 may be substantially equal to a length LEN of the gate electrode 260 shown in FIG. 6.

The interlayer insulating layer 270 may cover the gate electrode 260, and the first and second contact holes 281 and 291 may penetrate the interlayer insulating layer 270 and the gate insulating layer 250. In other words, the first contact hole 281 may be formed by removing a first part of the gate insulating layer 250 and the interlayer insulating layer 270, and the second contact hole 291 may be formed by removing a second part of the gate insulating layer 250 and the interlayer insulating layer 270. That is, the first and second contact holes 281 and 291 may penetrate the gate insulating layer 250 and the interlayer insulating layer 270 to contact the source area 243 and the drain area 245 respectively. The interlayer insulating layer 270 may include an insulating material. For example, the interlayer insulating layer 270 may include silicon oxide, silicon nitride, titanium oxide, tantalum oxide, or the like.

The first contact hole 281 may expose a part of the source area 243 of the active pattern 240 and may be spaced apart from the first side of the gate electrode 260 by about 7 um or more. In other words, a first distance DIS_1 between the gate electrode 260 and the center of the first contact hole 281 may be about 7 um or more.

The second contact hole 291 may expose a part of the drain area 245 of the active pattern 240 and may be spaced apart from the second side of the gate electrode 260 by about 7 um or more. In other words, a second distance DIS_2 between the gate electrode 260 and the center of the second contact hole 291 may be about 7 um or more.

In an example embodiment, a distance from the center of the first contact hole 281 to the center of the second contact hole 291 may be about 17 um or more.

The source electrode 280 may be disposed on the interlayer insulating layer 270 and may contact the source area 243 of the active pattern 240 through the first contact hole 281. The source electrode 280 may include a metal, an alloy, or a conductive metal oxide. For example, the source electrode 280 may include Au, Ag, Cu, Ni, Cr, Al, W, Mo, Ti, Ta or an alloy thereof, and may have a single layer or a multilayer structure including different metal layers. In addition, the source electrode 280 may correspond to the source terminal described with reference to FIG. 4. Accordingly, the source electrode 280 may be adjacent to the data driver 400 and may be electrically connected to the data driver 400 to receive the data voltage from the data driver 400.

The drain electrode 290 may be disposed on the interlayer insulating layer 270 and may contact the drain area 245 of the active pattern 240 through the second contact hole 291. The drain electrode 290 may include a metal, an alloy, or a conductive metal oxide. In an example embodiment, the drain electrode 290 may be formed together with the source electrode 280, and thus may include a same material as the source electrode 280. In addition, the drain electrode 290 may correspond to the drain terminal described with reference to FIG. 4. Accordingly, the drain electrode 290 may be adjacent to the demultiplexer 300 and may be electrically connected to the demultiplexer 300 to provide the data voltage to the demultiplexer 300.

A charge mobility of the first lighting test transistor TR1 may be determined according to a length of the components constituting the first lighting test transistor TR1 and a distance between the components. For example, as the first distance DIS_1 which is from the center of the first contact hole 281 filled with the source electrode 280 to the first side of the gate electrode 260, and the second distance DIS_2 which is from the center of the second contact hole 291 filled with the drain electrode 290 to the second side of the gate electrode 260 increases, a moving distance of charge moving from the source area 243 to the drain area 245 may increase. Accordingly, as the first and second distances DIS_1 and DIS_2 increase, the charge mobility of the first lighting test transistor TR1 may decrease. In addition, as the length LEN of the channel area 241 having a high resistance compared to the source and drain areas 243 and 245 increases, the charge mobility of the first lighting test transistor TR1 may decrease.

As described above, in the manufacturing process of the display device 1000, as the central portion (e.g., the central portion A in FIGS. 1 and 2) of the mother substrate (e.g., the mother substrate 10 in FIGS. 1 and 2) sags, the central portion may be close to the mask (e.g., mask 20 in FIGS. 1 and 2) or may contact the mask, thereby the static electricity having a voltage level of about 500V may be generated in the central portion. In order to prevent the dielectric breakdown phenomenon of the first lighting test transistor TR1 due to the static electricity, each of the first and second distances DIS_1 and DIS_2 of the first lighting test transistor TR1 may be set to about 7 um or more. In other words, since the first lighting test transistor TR1 is designed to have first or second distances DIS_1 and DIS_2 of about 7 um or more, the charge mobility of the first lighting test transistor TR1 may be lowered. Accordingly, the dielectric breakdown phenomenon of the first lighting test transistor TR1 may be prevented.

In addition, in an example embodiment, the length LEN of the gate electrode 260 may be about 3 um to about 4 um. Since the first lighting test transistor TR1 includes the gate electrode 260 having the length LEN of about 3 um to about 4 um, the charge mobility of the first lighting test transistor TR1 may be lowered. Accordingly, the dielectric breakdown phenomenon of the first lighting test transistor TR1 may be prevented.

Table 1 is illustrating whether an insulation breakdown phenomenon occurs in the first lighting test transistor TR1 according to changes in the first and second distances DIS_1 and DIS_2, when the length LEN of the gate electrode 260 is about 3.5 um. As shown in the table 1, when each of the first and second distances DIS_1 and DIS_2 is about 3.2 um, about 3.3 um, about 3.5 um, and about 6 um (i.e., in case of CASE 1, CASE 2, CASE 3, and CASE 4), the insulation breakdown phenomenon occurred in the first lighting test transistor TR1. On the other hand, when each of the first and second distances DIS_1 and DIS_2 is set to about 7 um, about 8.7 um, and about 11 um (i.e., in case of CASE 5, CASE 6, and CASE 7), the insulation breakdown phenomenon does not occur in the first lighting test transistor TR1.

TABLE 1

| | Each of the first and second distances (um) | Whether insulation breakdown phenomenon occurs |
|---|---|---|
| CASE 1 | 3.2 | Occurs |
| CASE 2 | 3.3 | Occurs |
| CASE 3 | 3.5 | Occurs |
| CASE 4 | 6 | Occurs |
| CASE 5 | 7 | Does not occur |
| CASE 6 | 8.7 | Does not occur |
| CASE 7 | 11 | Does not occur |

In an example embodiment, wherein a maximum distance of each of the first and second distances DIS_1 and DIS_2 of the first lighting test transistor TR1 may be determined corresponding to the preset voltage level set in the antistatic circuit unit 500. For example, the maximum distance of each of the first and second distances DIS_1 and DIS_2 of the first lighting test transistor TR1 may be about 11 um. As described above, when the antistatic circuit unit 500 measures the voltage level of the lighting test voltage to be higher than the preset voltage level, the lighting test voltage may not be provided to the first to third lighting test transistors TR1, TR2, and TR3. For example, the preset voltage level of the antistatic circuit unit 500 may be about 6.5V. When the first distance DIS_1 or the second distance DIS_2 of the first lighting test transistor TR1 is greater than about 11 um, the charge mobility of the first lighting test transistor TR1 may be lowered. Accordingly, the first lighting test transistor TR1 may not transmit the lighting test voltage having a voltage level of about 6.5V or less, and accordingly, the display device 1000 may not perform the lighting test.

In an example embodiment, the first distance DIS_1 may be substantially equal to the second distance DIS_2. For example, when the first distance DIS_1 is shorter than the second distance DIS_2, the moving distance of charges moving from the source area 243 to the channel area 241 may be shorter than the moving distance of charges moving from the channel area 241 to the drain area 245. In this case, the static electricity generated in the manufacturing process of the display device 1000 may be concentrated to the source area 243, and accordingly, the insulation breakdown phenomenon may occur in the first lighting test transistor TR1. In order to prevent the static electricity from being concentrated in the source or drain areas 243 and 245, the first and second distances DIS_1 and DIS_2 may be equal.

A structure of each of the second and third lighting test transistors TR2 and TR3 may be substantially equal to the structure of the first lighting test transistor TR1 described above. In addition, a display layer may be further disposed on the source and drain electrodes 280 and 290. In an example embodiment, when the display device 1000 is a liquid crystal display device, the display layer may include a first electrode, a second electrode, and a liquid crystal layer disposed between the first electrode and the second electrode. In another example embodiment, when the display device 1000 is an organic light emitting display device, the display layer may include a first electrode, a second electrode, and an organic emission layer disposed between the first electrode and the second electrode.

Figure 7:
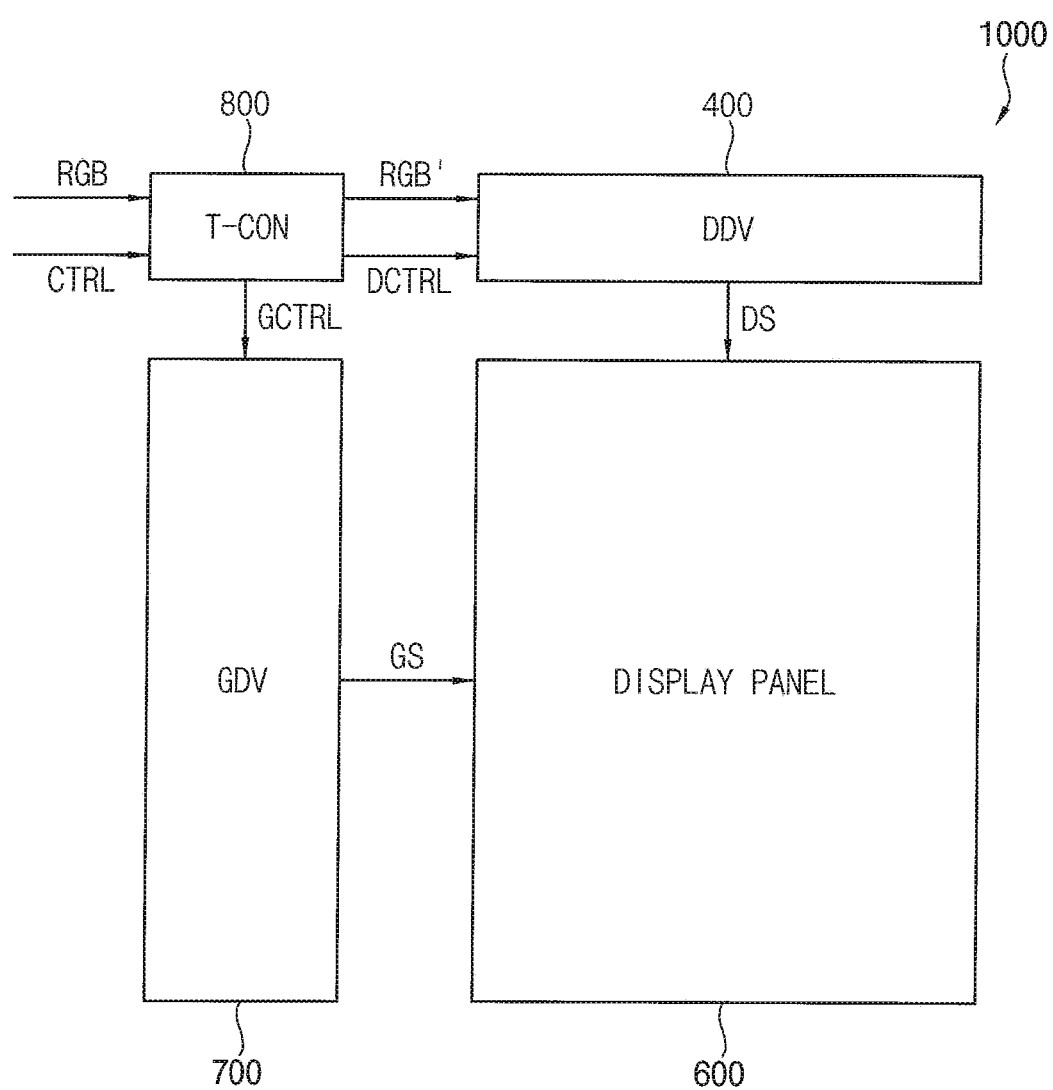
FIG. 7 is a block diagram of the display device of FIG. 3.

FIG. 7 is a block diagram of the display device of FIG. 3.

Referring to FIGS. 3 and 7, the display device 1000 may include a display panel 600, the data driver (DDV) 400, a gate driver 700, and a timing controller (T-CON) 800.

The display panel 600 may include the data lines DL, gate lines, pixels PX connected to the data lines DL and the gate lines, the lighting test circuit unit 200, the demultiplexer 300, and the antistatic circuit unit 500. The display panel 600 may receive the data voltage DS through the data lines DL and may receive a gate signal GS through the gate lines.

The gate lines may be disposed in the display area DA on the substrate 100. For example, the gate lines may extend in the row direction and may be arranged side by side in the column direction. Pixels PX may be formed in a region where the gate lines and data lines DL cross each other.

The data driver 400 may generate the data voltage DS based on an image data RGB' and a data control signal DCTRL provided from the timing driver 800, and may provide the data voltage DS to the pixels PX through the data lines DL. For example, the data control signal DCTRL may include an output data enable signal, a horizontal start signal, and a load signal.

The gate driver 700 may generate the gate signal GS based on a gate control signal GCTRL provided from the timing controller 800, and may provide the gate signal GS to the pixels PX through the gate lines. For example, the gate control signal GCTRL may include a vertical start signal, a clock signal, and the like. In an example embodiment, the gate driver 700 may be directly mounted in the non-display area NDA on the substrate 100. In another example embodiment, the gate driver 700 may be disposed on the FPCB in a COF form.

The timing controller 800 may receive an input image data RGB and a control signal CTRL from an external device. For example, the input image data RGB may be RGB data including red image data, green image data, and blue image data. The control signal CTRL may include a vertical synchronization signal, a horizontal synchronization signal, an input data enable signal, a master clock signal, and the like. The timing controller 800 may generate the gate control signal GCTRL, the data control signal DCTRL, and the image data RGB' based on the input image data RGB and the control signal CTRL. In addition, the timing controller 800 may provide the gate control signal GCTRL to the gate driver 700 and provide the data control signal DCTRL and the image data RGB' to the data driver 400.

The display device 1000 according to example embodiments may include the first to third lighting test transistors TR1, TR2, and TR3 having the first distance DIS_1 of about 7 um or more. Accordingly, the charge mobility of the first to third lighting test transistors TR1, TR2, and TR3 may be lowered, and the insulation breakdown phenomenon due to the static electricity generated in the manufacturing process of the display device 1000 may not occur. Accordingly, the display device 1000 may perform the lighting test, and whether the display device 1000 is damaged may be detected through the lighting test. In addition, the first to third lighting test transistors TR1, TR2, and TR3 may not be short. Therefore, the display quality may be improved, when the display device 1000 is driven.

Although certain example embodiments and implementations have been described herein, other embodiments and modifications will be apparent from this description. Accordingly, the present disclosure is not limited to such embodiments, but rather to the broader scope of the appended claims and various obvious modifications and equivalent arrangements as would be apparent to a person of ordinary skill in the art.

What is claimed is:

1. A display device comprising:
a substrate including a display area and a non-display area adjacent to the display area;
a plurality of pixel columns disposed in the display area on the substrate; and
a lighting test circuit unit disposed in the non-display area on the substrate, including a plurality of lighting test transistors, and providing a lighting test voltage to the pixel columns,
wherein each of the lighting test transistors comprises:
an active pattern disposed in the non-display area on the substrate and including a source area, a drain area, and a channel area;
a gate electrode disposed in the channel area on the active pattern;
an interlayer insulating layer covering the gate electrode and including a first contact hole, wherein the first contact hole exposes a part of the source area of the active pattern and is spaced apart from a first side of the gate electrode by 7 um or more; and
a source electrode contacting the source area of the active pattern through the first contact hole.

2. The display device of claim 1, wherein the interlayer insulating layer further includes a second contact hole exposing a part of the drain area of the active pattern and being spaced apart by 7 um or more from a second side of the gate electrode, and
each of the lighting test transistors further includes a drain electrode contacting the drain area of the active pattern through the second contact hole.

3. The display device of claim 2, wherein a distance from a center of the first contact hole to the first side of the gate electrode is equal to a distance from a center of the second contact hole to the second side of the gate electrode.

4. The display device of claim 2, wherein a length from the first side of the gate electrode to the second side of the gate electrode is 3 um to 4 um.

5. The display device of claim 2, wherein a distance between a center of the first contact hole and a center of the second contact hole is 17 um or more.

6. The display device of claim 2, wherein each of the lighting test transistors further includes a gate insulating layer being interposed between the substrate and the interlayer insulating layer and covering the active pattern, and
each of the first and second contact holes penetrates the gate insulating layer to expose the source and the drain areas, respectively.

7. The display device of claim 2, further comprising:
a data driver disposed in the non-display area on the substrate and generating a data voltage,
wherein the lighting test circuit unit is disposed between the pixel columns and the data driver.

8. The display device of claim 7, further comprising:
a demultiplexer disposed between the lighting test circuit unit and the pixel columns in the non-display area on the substrate, wherein the demultiplexer receives the data voltage from the data driver and provides the data voltage to the pixel columns.

9. The display device of claim 8, wherein the source electrode is adjacent to the data driver, and the drain electrode is adjacent to the demultiplexer.

10. The display device of claim 1, further comprising:
an antistatic circuit unit disposed in the non-display area on the substrate, electrically connected to the lighting test circuit unit, and measuring a voltage level of the lighting test voltage,
wherein, when the antistatic circuit unit measures the voltage level of the lighting test voltage to be higher than a preset voltage level, the lighting test voltage is not provided to the lighting test transistors.

11. The display device of claim 10, wherein a maximum distance between the first side of the gate electrode and the first contact hole is determined by the preset voltage level.

12. The display device of claim 1, wherein the pixel columns include:
a first pixel column in which a first pixel displaying a first color and a second pixel displaying a second color are repeatedly arranged;
a second pixel column in which a third pixel displaying a third color is arranged; and
a third pixel column in which the second pixel and the first pixel are repeatedly arranged.

13. The display device of claim 12, wherein the lighting test circuit unit alternately provides the lighting test voltage to the first pixel included in the first pixel column and the third pixel column, and the second pixel included in the first pixel column and the third pixel column.

14. The display device of claim 13, wherein the lighting test transistors include a first lighting test transistor, a second lighting test transistor, and a third lighting test transistor,
the first and second lighting test transistors are electrically connected to the first pixel column and the third pixel column, and
the third lighting test transistor is electrically connected to the second pixel column.

15. The display device of claim 14, wherein the lighting test voltage includes a first lighting test voltage, a second lighting test voltage, and a third lighting test voltage,
the first lighting test transistor provides a first lighting test voltage to the first pixel in response to a first test control signal,
the second lighting test transistor provides a second lighting test voltage to the second pixel in response to a second test control signal, and
the third lighting test transistor provides a third lighting test voltage to the third pixel in response to a third test control signal.

16. The display device of claim 1, further comprising:
a data driver generating a data voltage which is provided to the pixel columns;
a gate driver generating a scan signal which is provided to the pixel columns; and
a timing controller generating a control signal which controls the data driver and the gate driver.

* * * * *